(12) United States Patent
Yoon et al.

(10) Patent No.: US 12,715,691 B2
(45) Date of Patent: Aug. 25, 2026

(54) STOCKER AND STOCKER SYSTEM

(71) Applicant: SEMES CO., LTD., Cheonan-si (KR)

(72) Inventors: Sang Min Yoon, Hwaseong-si (KR); Seung Won Kim, Yongin-si (KR); Doo Bong Kim, Daegu (KR); Young Woo Kim, Cheonan-si (KR); Min Jae Park, Ulsan (KR)

(73) Assignee: SEMES CO., LTD., Chungcheongnam-do (KR)

( * ) Notice: Subject to any disclaimer, the term of this patent is extended or adjusted under 35 U.S.C. 154(b) by 241 days.

(21) Appl. No.: 18/412,942

(22) Filed: Jan. 15, 2024

(65) Prior Publication Data

US 2024/0300738 A1 Sep. 12, 2024

(30) Foreign Application Priority Data

Mar. 6, 2023 (KR) ........................ 10-2023-0029123

(51) Int. Cl.

| | |
|---|---|
| ***B65G 1/06*** | (2006.01) |
| ***B25J 11/00*** | (2006.01) |
| ***B66C 13/48*** | (2006.01) |
| ***B66C 23/50*** | (2006.01) |

(Continued)

(52) U.S. Cl.

CPC ............. *B65G 1/06* (2013.01); *B25J 11/0095* (2013.01); *B66C 13/48* (2013.01); *B66C 23/50* (2013.01); *B66C 23/88* (2013.01); *H10P 72/3404* (2026.01); *B65G 2201/0297* (2013.01)

(58) Field of Classification Search

CPC ............... B65G 1/06; B65G 2201/0297; B25J 11/0095; B66C 13/48; B66C 23/50; B66C 23/88; H01L 21/67769; H01L 21/67775; H10P 72/3404; H10P 72/3408

See application file for complete search history.

(56) References Cited

U.S. PATENT DOCUMENTS

| | | | | |
|---|---|---|---|---|
| 9,327,952 | B1 * | 5/2016 | Kolharkar | B65G 1/0435 |
| 10,543,984 | B1 * | 1/2020 | Alduaiji | G06Q 10/08 |
| 11,992,912 | B2 * | 5/2024 | Sawachi | H01L 21/67126 |

(Continued)

FOREIGN PATENT DOCUMENTS

| | | |
|---|---|---|
| JP | 10-338306 | 12/1998 |
| JP | 2006049454 A * | 2/2006 |

(Continued)

OTHER PUBLICATIONS

Notice of Provision of Information dated Apr. 23, 2026 for Korean Patent Application No. 10-2023-0029123 and its English translation by Google Translate.

*Primary Examiner* — Gerald McClain

(74) *Attorney, Agent, or Firm* — WOMBLE BOND DICKINSON (US) LLP

(57) ABSTRACT

A stocking device includes a case including a central portion therein, extending a first direction, a longitudinal direction, and provided with a first storage portion and a second storage portion on both sides of the central portion in a second direction, a width direction, a shelf portion provided in the first storage portion and the second storage portion and having a plurality of shelves with an electronic component loaded thereon, a first port located in the first storage portion, and having a first open surface in which at least a portion of a side of the case is open in the second direction to communicate externally.

19 Claims, 14 Drawing Sheets

(51) Int. Cl.

| | |
|---|---|
| ***B66C 23/88*** | (2006.01) |
| ***H10P 72/30*** | (2026.01) |

(56) References Cited

U.S. PATENT DOCUMENTS

| | | | | |
|---|---|---|---|---|
| 2010/0215461 | A1* | 8/2010 | Kamikawa | H01L 21/67727 414/222.13 |
| 2010/0290873 | A1* | 11/2010 | Bonora | H01L 21/67769 414/225.01 |
| 2016/0035607 | A1* | 2/2016 | Lee | H01L 21/6773 414/808 |
| 2016/0273836 | A1* | 9/2016 | Obara | F27B 5/04 |
| 2017/0334696 | A1* | 11/2017 | Otto | B66F 9/18 |
| 2018/0029796 | A1* | 2/2018 | De Vries | B65G 1/0435 |
| 2019/0248581 | A1* | 8/2019 | Adachi | H01L 21/67769 |
| 2019/0375593 | A1 | 12/2019 | Sai et al. | |
| 2020/0098611 | A1* | 3/2020 | Kuwahara | H01L 21/67733 |
| 2021/0020475 | A1* | 1/2021 | Kuwahara | B65G 47/90 |
| 2021/0043487 | A1 | 2/2021 | Goto | |
| 2023/0253227 | A1* | 8/2023 | Kang | H02J 50/12 414/222.01 |
| 2024/0158168 | A1* | 5/2024 | Park | B66F 9/063 |
| 2024/0304484 | A1* | 9/2024 | Kim | H01L 21/6773 |
| 2025/0316515 | A1* | 10/2025 | Kim | H01L 21/67294 |

FOREIGN PATENT DOCUMENTS

| | | | | |
|---|---|---|---|---|
| JP | 2007-22677 | | 2/2007 | |
| JP | 2019-214437 | | 12/2019 | |
| JP | 2022-104295 | | 7/2022 | |
| KR | 20070069494 | A * | 7/2007 | H02J 50/10 |
| KR | 10-2008-0077121 | | 8/2008 | |
| KR | 10-2016-0015092 | | 2/2016 | |
| KR | 10-2431540 | | 8/2022 | |
| WO | 2008/064121 | | 5/2008 | |

* cited by examiner

STOCKER AND STOCKER SYSTEM

CROSS-REFERENCE TO RELATED APPLICATION(S)

This application claims benefit of priority to Korean Patent Application No. 10-2023-0029123 filed on Mar. 6, 2023 in the Korean Intellectual Property Office, the disclosure of which is incorporated herein by reference in its entirety.

BACKGROUND

1. Field

The present disclosure relates to an SSD gender stocker and a stocking system including the same.

2. Description of Related Art

In a semiconductor device manufacturing process, materials such as wafers may be stored in a stocking device. In detail, containers for storing wafers, such as Front Opening Unified Pod (FOUP) and Front Opening Shipping Box (FOSB), may be stored in a stocking device equipped with a plurality of shelves. In this case, the existing stocking system is equipped with a plurality of shelves installed on the floor of the building and a crane moving along the shelves. A plurality of shelves are installed in the vertical and horizontal directions, and are equipped with a storage shelf on which goods may be loaded by a crane, and an entry/exit port for a transport vehicle running along a rail installed on the ceiling or near the ceiling to unload the goods. The crane transfers goods between a storage shelf and an entry/exit port.

On the other hand, recently, since electronic components equipped with multiple chips, such as a Solid State Disk (SSD), have been appearing, a stocking system in which electronic components such as SSD genders may be stored are required. In the related art, workers use a manual method to store SSD gender, and thus an automated method is required.

SUMMARY

An aspect of the present disclosure is to provide a stocking device and a stocking system.

According to an aspect of the present disclosure, the following stocking device and stocking system are provided.

According to an aspect of the present disclosure, a stocking device includes a case including a central portion therein, extending a first direction, a longitudinal direction, and provided with a first storage portion and a second storage portion on both sides of the central portion in a second direction, a width direction, a shelf portion provided in the first storage portion and the second storage portion and having a plurality of shelves with an electronic component loaded thereon, a first port located in the first storage portion, and having a first open surface in which at least a portion of a side of the case is open in the second direction to communicate externally, the first port being a port through which the electronic component enters and exits, a second port located in the second storage portion and having a second open surface in which at least a portion of the side of the case is open in the second direction to communicate externally, the second port being a port through which the electronic component enters and exits, and a crane installed in the central portion and transporting the electronic component.

The stocking device may further include a charging pad installed outside of the case, installed on a first port side, and charging a mobile robot.

The first port may further include a first auto shutter provided on the first open surface and opening and closing the first open surface, and the second port may further include a second auto shutter provided on a second inner side surface communicating with the central portion and opening and closing the second inner side surface.

In the shelf portion, a shelf frame and a plurality of shelves may be arranged in the first direction and a third direction, a height direction of the case. The plurality of shelves may have a structure in which both sides in the second direction are open such that the electronic component is transferred in the second direction.

The shelf may include a shelf support member extending in the second direction, and a shelf prop member provided below the shelf support member. The shelf support member may include a seating surface provided to support the electronic component, and a locking member provided on an upper portion of the seating surface and having both ends bent in the first direction to prevent the electronic component from being separated.

The crane may further include a driving rail disposed in the central portion and extending in the first direction, a body frame extending in the third direction, connected to the driving rail and moving in the first direction, and a handler device moving in the third direction inside the body frame and gripping and transferring the electronic component.

According to an aspect of the present disclosure, a stocking system includes a case including a central portion therein, extending in a first direction, a longitudinal direction, and provided with a first storage portion and a second storage portion on both sides of the central portion in a second direction, a width direction, a shelf portion provided in the first storage portion and the second storage portion and having a plurality of shelves with an electronic component loaded thereon, a first port located in the first storage portion, and having a first open surface in which at least a portion of a side of the case is open in the second direction to communicate externally, the first port being a port through which the electronic component enters and exits, a second port located in the second storage portion, and having a second open surface in which at least a portion of the side of the case is open in the second direction to communicate externally, the second port being a port through which the electronic component enters and exits, a crane installed in the central portion and transferring the electronic component, and a mobile robot disposed on a first open surface side and transferring the electronic component into the first port.

The stocking system may further include a first detection sensor installed on the first open surface side and detecting an approach of the mobile robot, a second detection sensor installed on a second open surface side and detecting an approach of a worker, and a control unit connected to the crane, the first detection sensor, and the second detection sensor. The control unit may stop an operation of the crane when receiving an approach signal from either the first detection sensor or the second detection sensor.

The first port may include a first auto shutter opening and closing the first open surface communicating externally, the second port may include a second auto shutter provided on one side communicating with the central portion and opening and closing the one side, and the control unit may open the first auto shutter when receiving an approach signal from the first detection sensor, and may close the second auto shutter when receiving an approach signal from the second detection sensor.

According to an aspect of the present disclosure, a stocking device includes a case including a central portion therein, extending in a first direction, a longitudinal direction, and having a first storage portion and a second storage portion on both sides of the central portion in a second direction, a width direction, a shelf portion provided in the first storage portion and the second storage portion and having a plurality of shelves with electronic components loaded thereon, a first port located in the first storage portion, and having a first open surface in which at least a portion of a side of the case is open in the second direction to communicate externally, the first port being a port through which the electronic components enter and exit, a second port located in the second storage portion, and having a second open surface in which at least a portion of the side of the case is open in the second direction to communicate externally, the second port being a port through which the electronic components enter and exit, a crane installed in the central portion and transferring the electronic components, and a charging pad installed outside of the case, installed on a side of the first port, and charging a mobile robot. In the shelf portion, a shelf frame and a plurality of shelves are arranged in the first direction and a third direction, a height direction of the case. The plurality of shelves have a structure in which both sides in the second direction are open such that the electronic components are transferred in the second direction.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
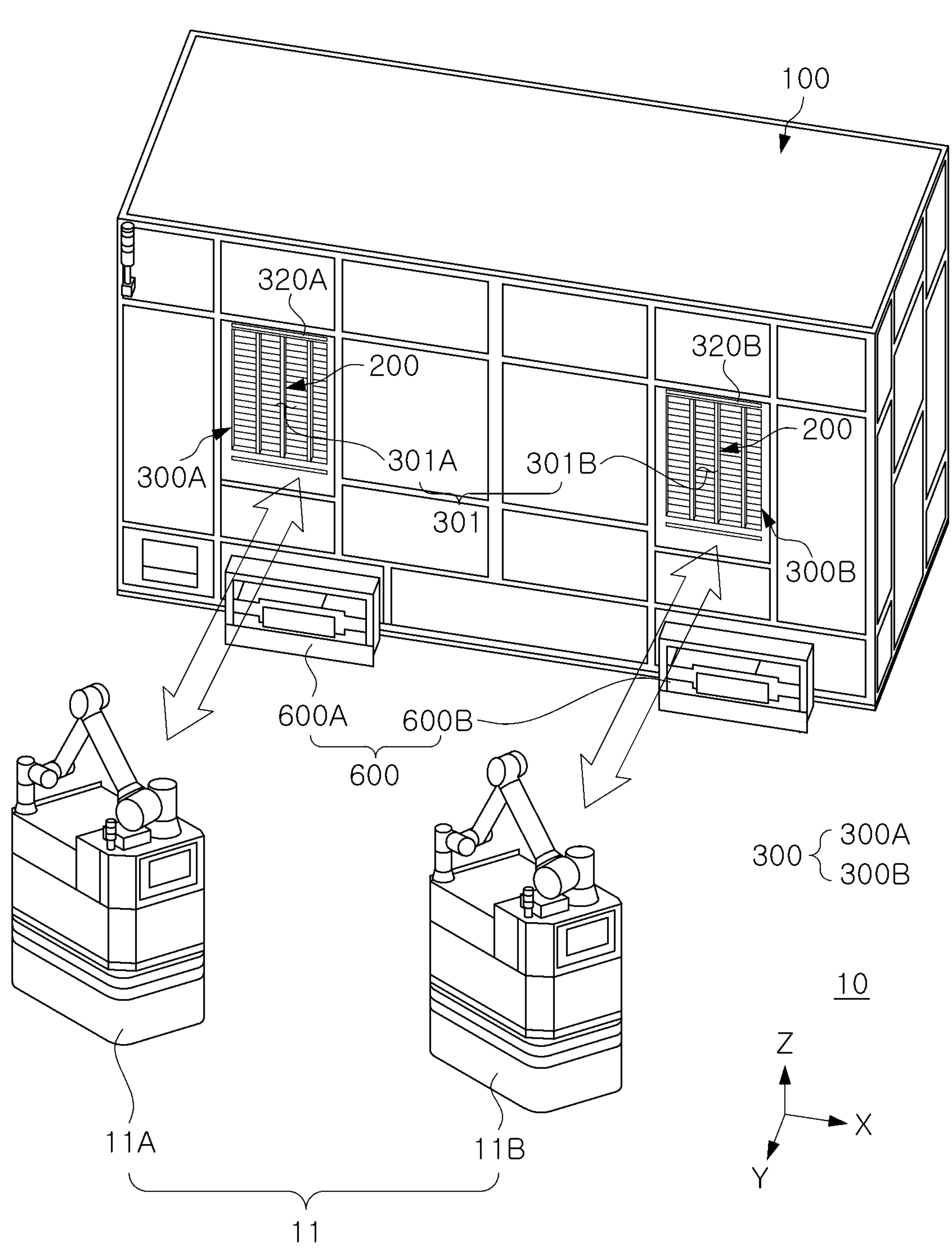
FIG. 1 is a schematic perspective view of a stocking device according to an embodiment.

Hereinafter, embodiments will be described in detail such that those skilled in the art may easily practice the present disclosure with reference to the accompanying drawings. However, in describing embodiments in detail, if it is determined that a detailed description of a related known function or configuration may unnecessarily obscure the gist of the present disclosure, the detailed description will be omitted. In addition, the same reference numerals are used throughout the drawings for parts having similar functions and actions. In addition, in the present specification, terms such as 'on,' 'upper portion,' 'upper surface,' 'below,' 'lower portion,' 'lower surface,' 'bottom surface,' 'side' and the like are based on the drawings, and may be changed depending on the direction in which components are actually disposed.

In addition, throughout the specification, when a portion is said to be 'connected' to another part, it is not only 'directly connected,' but also 'indirectly connected' with other components therebetween. Further, 'including' a certain component means that other components may be further included, rather than excluding other components unless otherwise stated.

Figure 2:
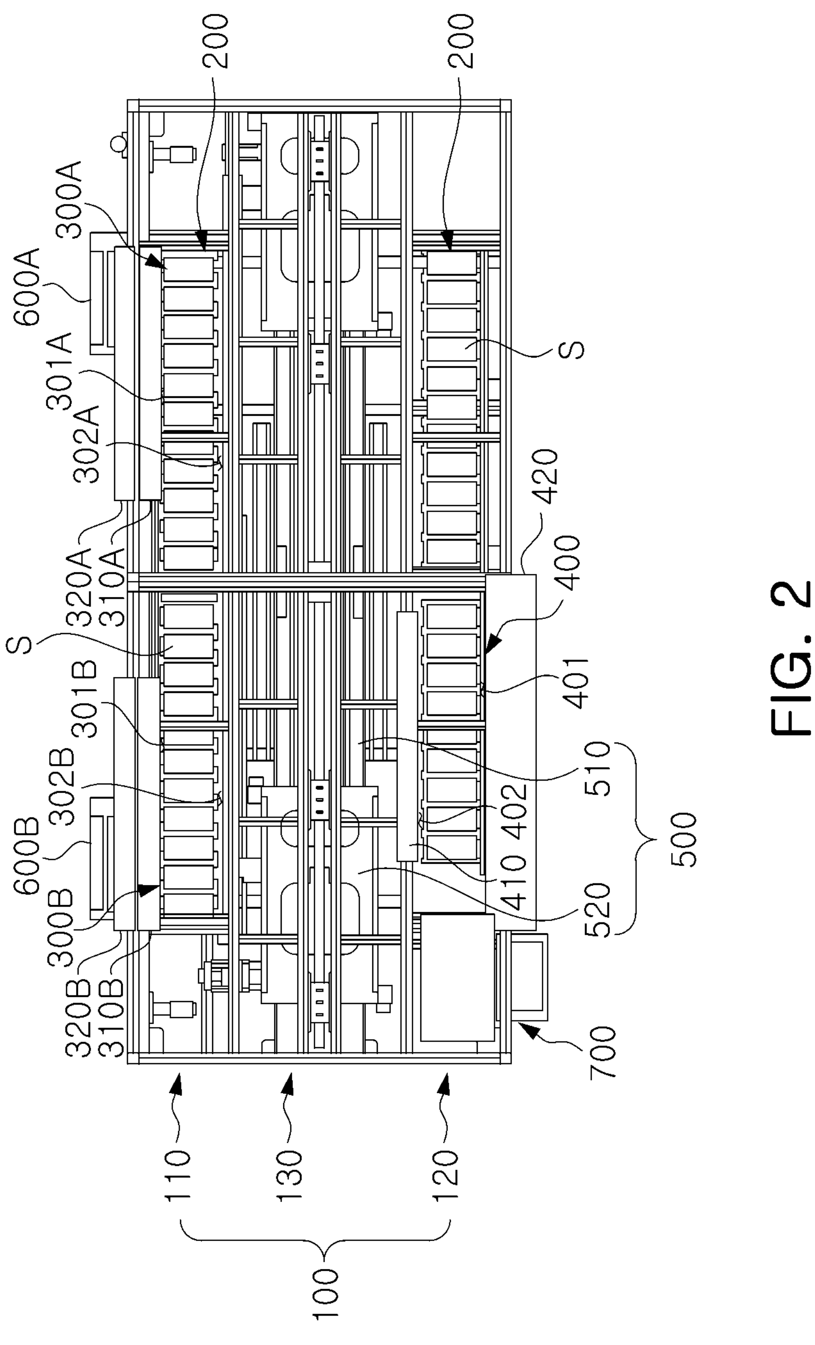
FIG. 2 is a schematic plan view of a stocking device according to an embodiment viewed from the top.
Figure 3:
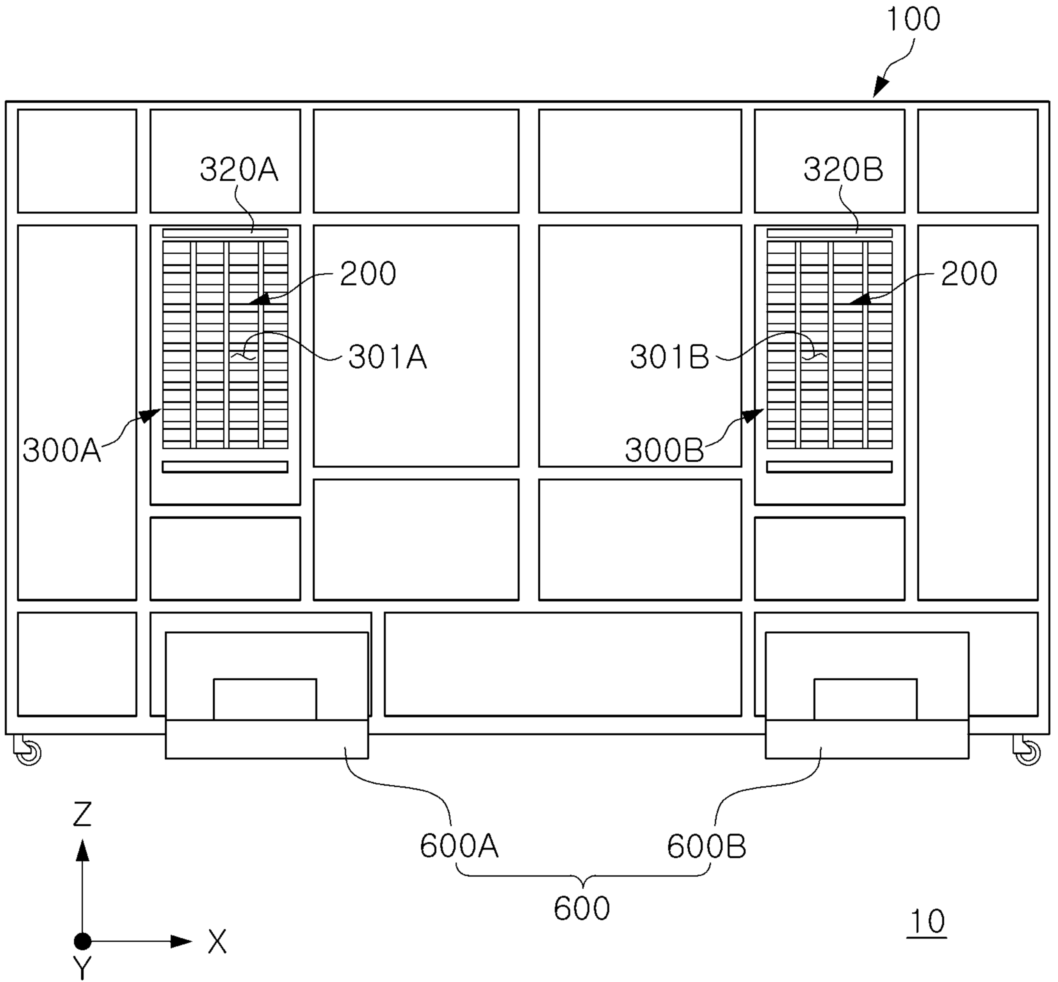
FIGS. 3 to 5 are plan views of the stocking device according to an embodiment as viewed from the front, side, and rear.
Figure 4:
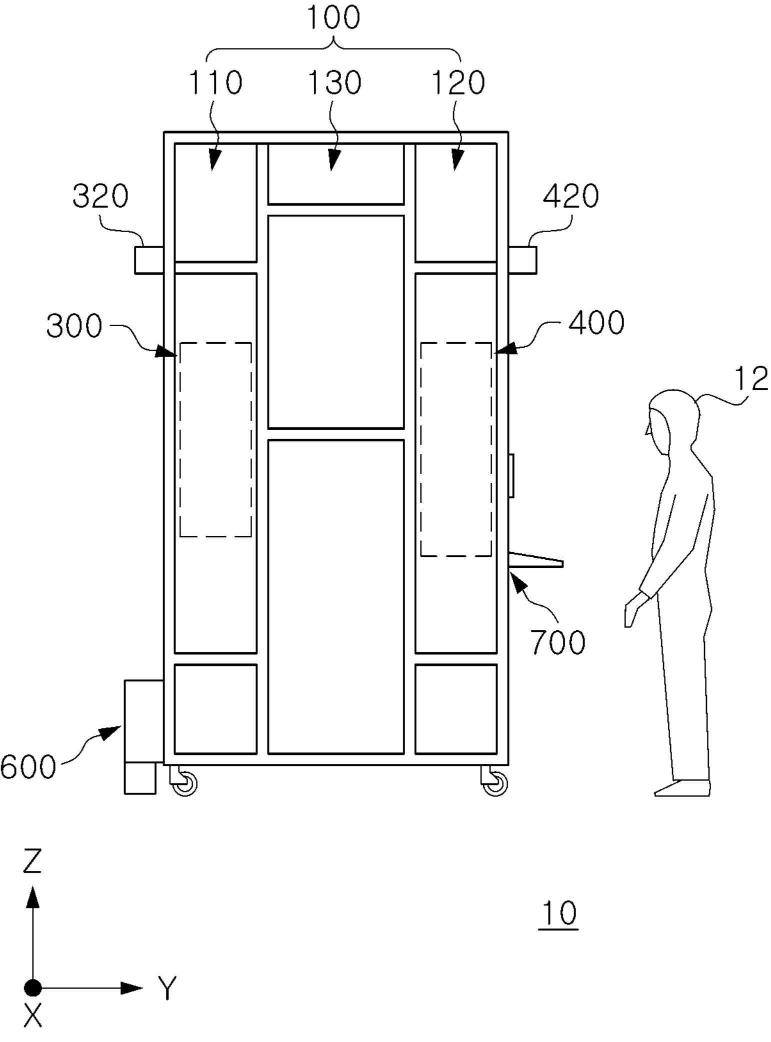
Figure 5:
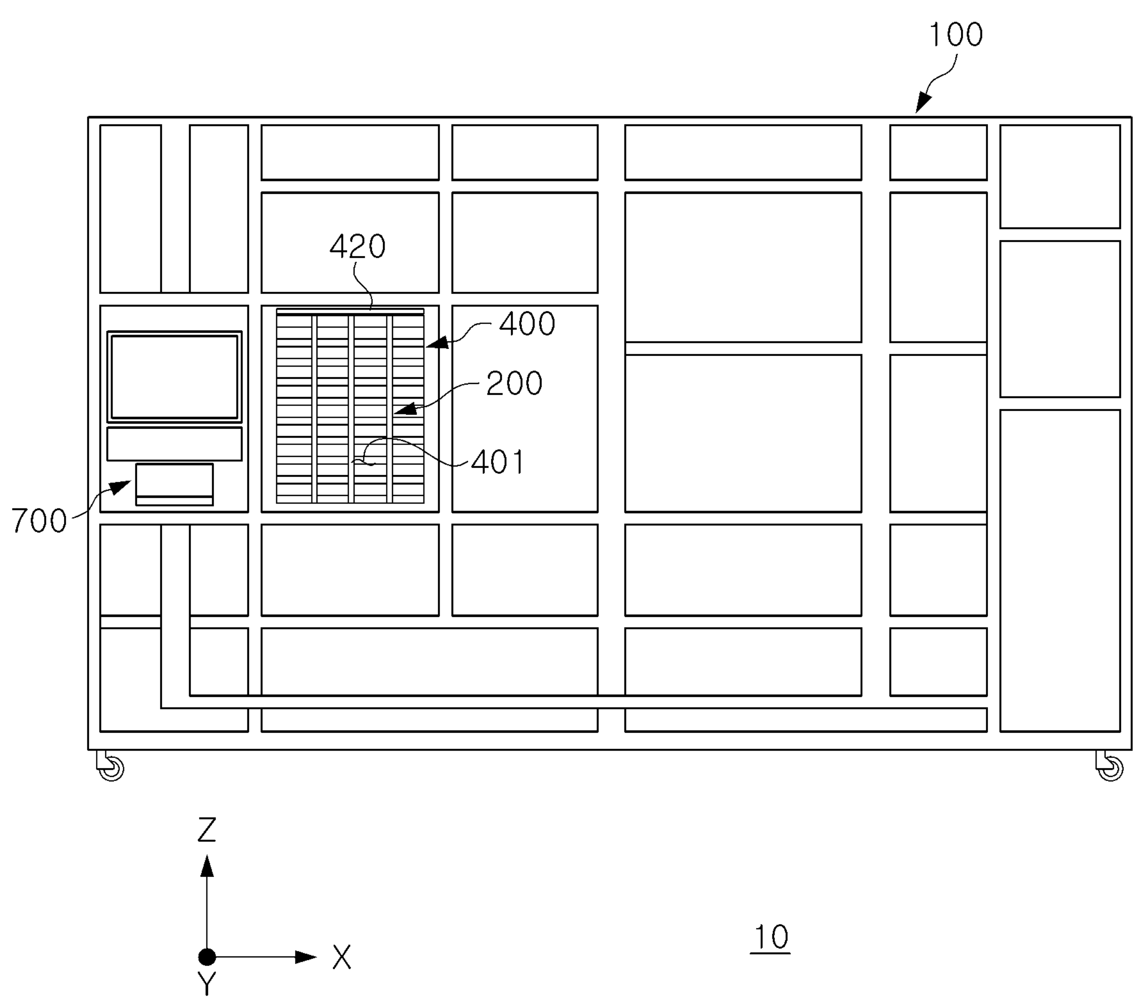

FIGS. 1 to 5 illustrate a stocking device according to an embodiment. FIG. 1 is a schematic perspective view of a stocking device according to an embodiment, FIG. 2 is a schematic plan view of the interior of a stocking device according to an embodiment, viewed from the top, and FIGS. 3 to 5 are plan views of the stocking device of FIG. 1 as seen from the front, rear, and side. Hereinafter, a stocking device according to an embodiment will be described with reference to FIGS. 1 to 5.

A stocking device 10 according to an embodiment includes a case 100, a shelf portion 200, a first port 300, a second port 400, a crane 500, and a control unit (not illustrated), controlling respective components of the stocking device 10. The stocking device 10 allows electronic components S to enter and be removed from the outside, and may store the electronic components S. At this time, the electronic component S may be, for example, an SSD gender or a test module testing the SSD gender.

On the other hand, in this specification, the longitudinal direction of the case 100 may be referred to as a first direction, the width direction thereof may be referred to as a second direction, and the height direction thereof may be referred to as a third direction. For example, in the drawing, the first direction, the longitudinal direction, may be the X-direction, the second direction, the width direction, may be the Y-direction, and the third direction, the height direction, may be the Z-direction.

The case 100 includes a central portion 130 disposed therein and extending in a first direction, the longitudinal direction, and a first storage portion 110 and a second storage portion 120 provided on both sides of the central portion 130 in the second direction, the width direction. The first storage portion 110 and the second storage portion 120 may be provided with a shelf portion 200 on which the electronic components S are stored, and the crane 500 is installed in the central portion 130. In this case, the shelf portion 200 may be provided with a plurality of shelves 210 (see FIG. 8) on which the electronic components S are loaded.

Furthermore, the first port 300 may be located in the first storage portion 110, and the second port 400 may be located in the second storage portion 120. The first port 300 and the second port 400 refer to parts of the shelf portion 200, which may communicate externally to allow an entry and exit therethrough, among the shelf portions provided in the first storage portion 110 and the second storage portion 120. Accordingly, the plurality of shelves 210 (see FIG. 8), to be described later, may also be provided in the first port 300 and the second port 400, and at least a portion of the side surface of the first port 300 and the second port 400 is open in the second direction to communicate externally. For example, the first port 300 has a first open surface 301 in which at least a portion of the side surface of the case 100 is open in the second direction to communicate externally, and the second port 400 has a second open surface 401 in which at least a portion of the side surface of the case 100 is open in the second direction to communicate externally. Accordingly, the first port 300 allows the electronic component S to enter and exit through the first open surface 301, and the second port 400 allows the electronic components S to enter and exit through the second open surface 401.

On the other hand, as illustrated in FIGS. 1 to 3, the stocking device 10 according to an embodiment may be provided with two first ports 300 and one second port 400. For example, the first port 300 may be provided with a 1-1 port 300A provided on one side and a 1-2 port 300B provided on the other side. Hereinafter, the description will be made based on the first port 300, but the configurations of the 1-1 port 300A and the 1-2 port 300B may be described identically to those of the first port 300.

In the stocking device 10 according to an embodiment, the electronic components S may be automatically input and output by a mobile robot 11 through the first port 300, and the electronic component S may be input and output manually by a worker 12 through the second port 400. In this case, the mobile robot 11 may be an Auto Mobile Robot (AMR). In this case, since entry and exit through the first port 300 are performed by the mobile robot 11, and entry and exit through the second port 400 are performed by the worker 12, the first port 300 may be located higher from the ground than the second port 400. However, as long as the stocking device 10 according to an embodiment is in communication externally and allows entry and exit of the electronic component S into the case 100, locations and structures of the first port 300 and the second port 400 are not particularly limited.

In addition, the first port 300 and the second port 400 may have inner side surfaces that are open and communicate with the central portion 130 to transfer the input and output electronic components S to the shelf portion 200 provided therein. The first port 300 has a first inner side surface 302 that is open and disposed on a position opposite to the first open surface 301, and the second port 300 has a second inner side surface 402 that is open and disposed on a position opposite to the second open surface 401.

The crane 500 may transfer the electronic component S entering and exiting from the first port 300 or the second port 400 within the case 100 to the shelf portion 200 through the first inner side surface 301 or the second inner side surface 402, and conversely, may transfer the electronic component S stored in the shelf portion 200 to the first port 300 or the second port 400 through the first inner side surface 301 or the second inner side surface 402.

Therefore, according to the stocking device 10 according to an embodiment of the present disclosure, the electronic components S such as SSD gender, which were stored only in the related art manual method, may be automatically loaded and unloaded by the mobile robot 11 on one side, and on the other side, may enter and exit manually by the worker 12. Additionally, inside the case 100, the electronic component S may be stored in the shelf portion 200 by the crane 500.

Furthermore, the stocking device 10 according to an embodiment may further include a charging pad 600 installed outside of the case 100 and installed on the first port 300 side to charge the mobile robot 11. In more detail, the charging pad 600 may be located below the first port 300, and the charging pad 600 may include a first charging pad 600A provided on the 1-1 port 300A side and a second charging pad 600B provided on the 1-2 port 300B side, like in the first port 300. Hereinafter, the description will be made based on the charging pad 600, but the configuration of the charging pad 600 may be applied to the first charging pad 600A and the second charging pad 600B. Therefore, in the stocking device 10 according to an embodiment, the mobile robot 11 may be charged in the process in which the mobile robot 11 inputs and outputs the electronic component S through the first port 300.

Conversely, a control unit 700 may be further provided on the outside of the case 100 on the second port 400 side, and the control unit 700 may control respective components of the stocking device 10 according to an embodiment. The control unit 700 may notify the worker 12 of the status of respective components, for example, the loading status or alignment status of the electronic components S through an alarm, or may display the status as a UI on a display that the worker 12 may check. In addition, the control unit 700 may further include an operation unit (not illustrated) that may be operated by the worker 12, and respective components of the stocking device 10 may be operated through the operation unit (not illustrated).

In addition, the first port 300 is provided on the first open surface 301 and includes a first auto shutter 310 that opens and closes the first open surface 301 in communication externally, and the first auto shutter 310 may open and close between the outside and the first port 300. The second port 400 is provided on the second inner side surface 402 in communication with the central portion 130, and may include a second auto shutter 410 that opens and closes the second inner side surface 402. The second inner side surface 402 through which the second port 400 communicates with the central portion 130 may be provided in a position opposite to the second open surface 401. In this case, the second auto shutter 410 installed in a position opposite the second open surface 401 may open and close between the crane 500 and the second port 400.

For example, the first auto shutter 310 may open and close the first open surface 301 to open or block the first port 300 externally, and the second auto shutter 410 may open or close the second inner side surface 402 opposite the second open surface 401 to open or block the second port 400 internally, to prevent safety accidents for workers 12.

Furthermore, the first port 300 may further include a first detection sensor 320 installed on the first open surface 301 side to detect the approach of the mobile robot 11, and a second detection sensor 420 installed on the second open surface 401 side to detect the approach of the worker 12. The first detection sensor 320 and the second detection sensor 420 may transmit an approach signal to the control unit 700 when the mobile robot 11 or the worker 12 approaches a preset sensor area.

At this time, the control unit 700 may be connected to the first detection sensor 320, the second detection sensor 420, and respective components of the stocking device 10, and when either the first detection sensor 320 or the second detection sensor 420 sends an approach signal detecting the approach of the mobile robot 11 or the worker 12, the control unit 700 may receive the signal and stop the operation of the crane 500. Accordingly, the transfer of the electronic component S by the crane 500 in the inside of the case 100 and inputs and outputs of the electronic component S by the mobile robot 11 or the worker 12 outside the case 100 may be prevented from colliding with each other, and safety accidents for the worker 12 may be prevented.

Thereafter, a signal that the mobile robot 11 or the worker 12 moves away is sent by the first detection sensor 320 or the second detection sensor 420, the control unit 700 may receive the signal and operate the crane 500 again. Without being limited thereto, the mobile robot 11 or the worker 12 may send a signal of completion of input and output of the electronic component S to the control unit 700 through the operation unit (not illustrated), to re-operate the crane 500.

Furthermore, the control unit 700 may receive an approach signal of the mobile robot 11 from the first detection sensor 320 and open the first auto shutter 310. Accordingly, in the stocking device 10 according to an embodiment, the first auto shutter 310 is automatically opened as the mobile robot 11 approaches, and input and output of the electronic component S from the mobile robot 11 may be performed automatically. Additionally, the control unit 700 may receive an approach signal of the worker 12 from the second detection sensor 420 and close the second auto shutter 410. As a result, the stocking device 10 may ensure the safety of the worker 12 even when the worker 12 approaches and manually performs input and output of the electronic component S.

Thereafter, when a signal that the mobile robot 11 or the worker 12 moves away by the first detection sensor 320 or the second detection sensor 420, the control unit 700 may receive the signal, close the first auto shutter 310, and open the second auto shutter 410 again. Without being limited thereto, the mobile robot 11 or the worker 12 may send a signal of completion of input and output of the electronic component S to the control unit 700 through the operation unit (not illustrated), such that the first auto shutter 310 may be closed again or the second auto shutter 410 may be opened again.

Furthermore, the stocking device 10 according to an embodiment may further include a third detection sensor (not illustrated) detecting the alignment of the charging pad 600 and the mobile robot 11. The third detection sensor (not illustrated) may be installed on the first port 300 side, and may transmit a signal to the mobile robot 11 by detecting whether the charging pad 600 and the mobile robot 11 are aligned in a direction parallel to the second direction. The mobile robot 11 may receive the signal and be driven to align with the charging pad 600 in a direction parallel to the second direction, and as a result, charging of the charging pad 600 may be facilitated.

Figure 8:
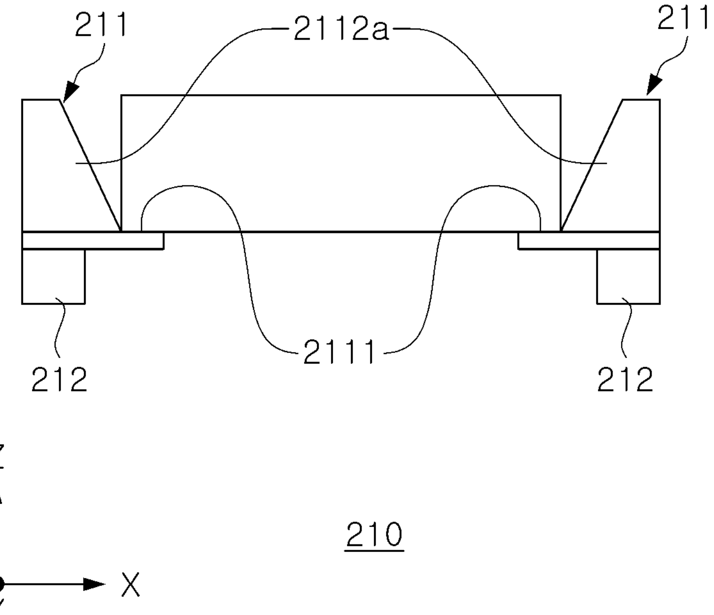
FIG. 8 is a plan view of FIG. 7 viewed in a second direction.

In addition, the stocking device 10 according to an embodiment may further include a fourth detection sensor (not illustrated) installed on the first open surface 301 side and detecting the alignment between the hand (not illustrated) of the mobile robot 11 and the shelf 210 (see FIG. 8). The fourth detection sensor (not illustrated) may detect the alignment of the hand (not illustrated) of the mobile robot 11 and the shelf 210 (see FIG. 8) and send a signal to the mobile robot 11, and the mobile robot 11 may receive the signal and control the hand (not illustrated) to be aligned with the shelf 210 (see FIG. 8) in a direction parallel to the second direction.

Figure 6:
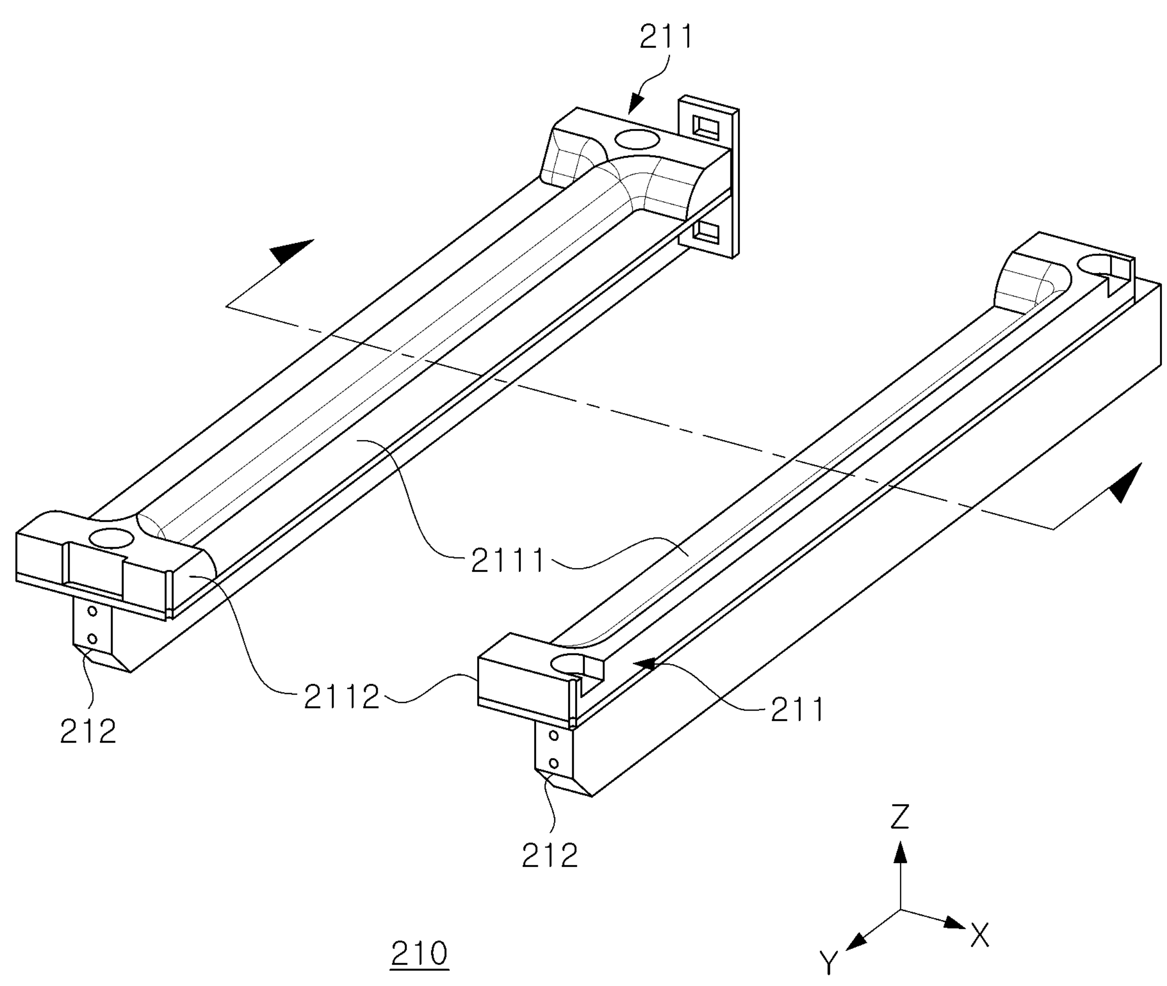
FIG. 6 is a schematic perspective view of a shelf according to an embodiment.
Figure 7:
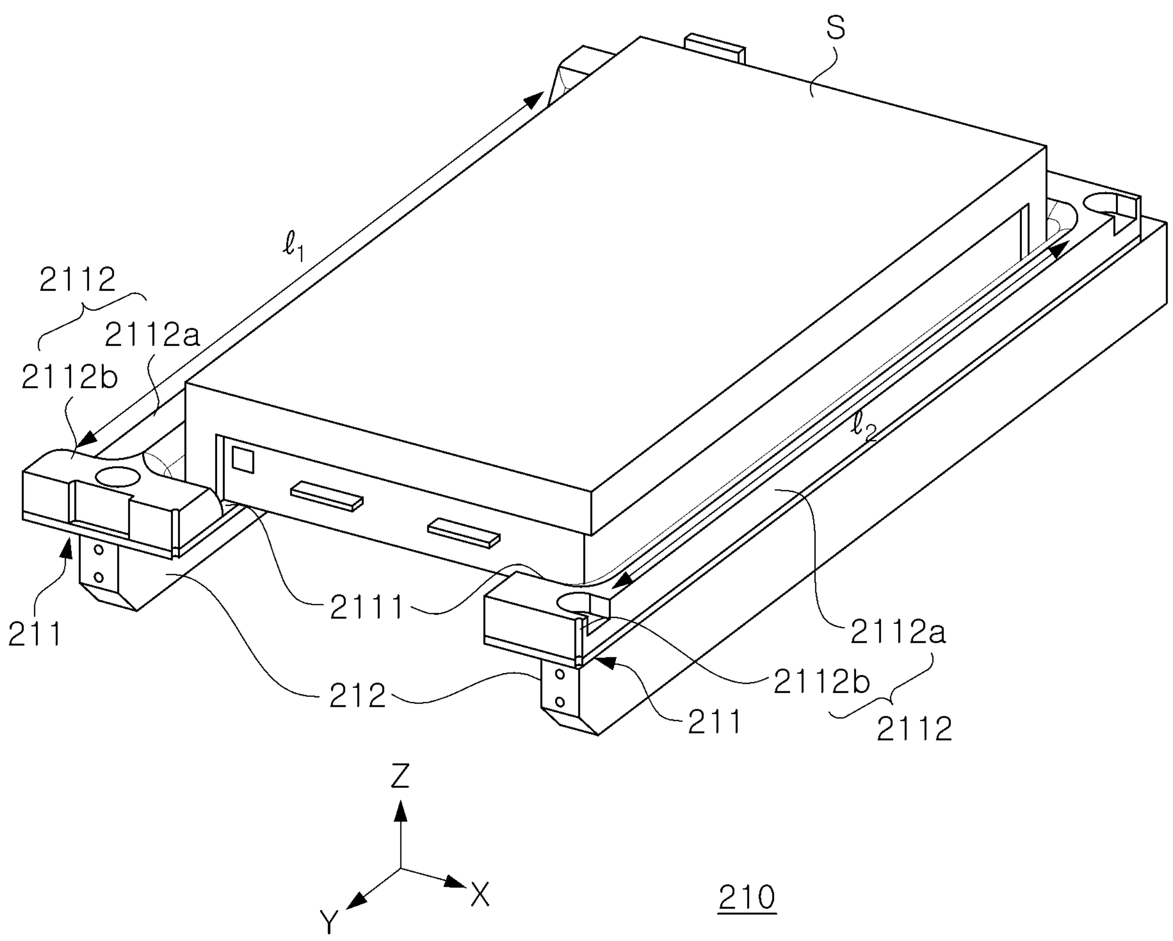
FIG. 7 is a perspective view illustrating electronic components mounted on the shelf of FIG. 6.
Figure 9:
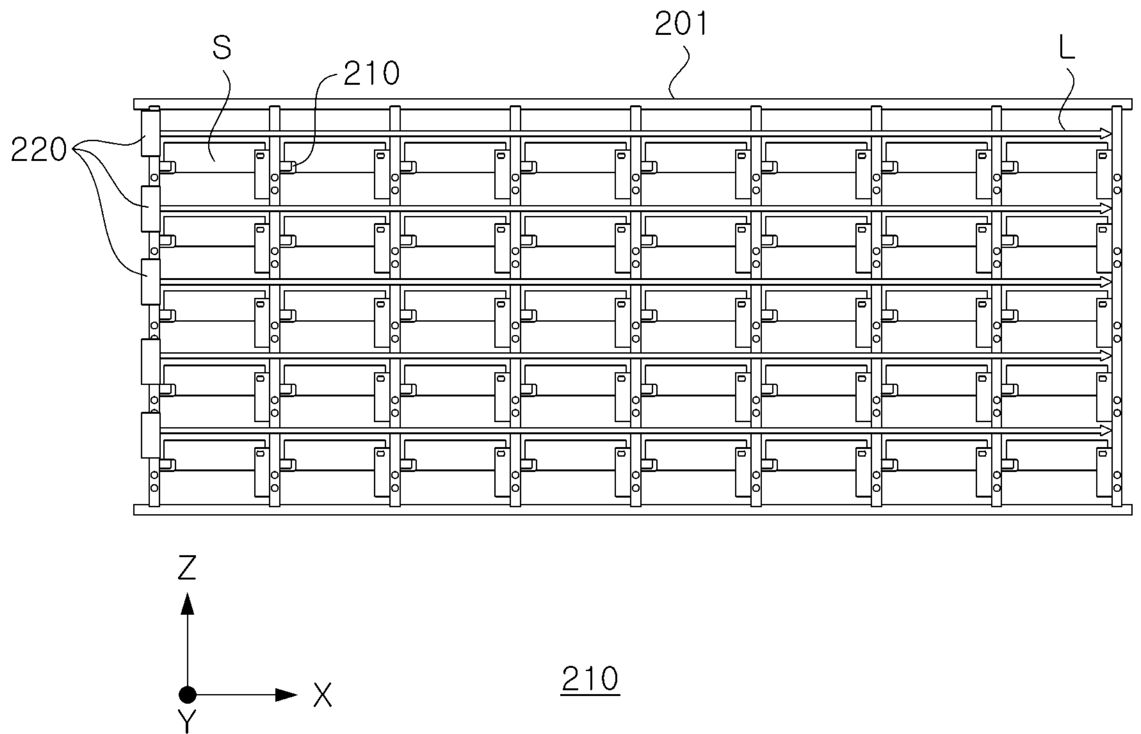
FIG. 9 is a plan view of a shelf portion according to an embodiment as seen from a second direction.
Figure 10:
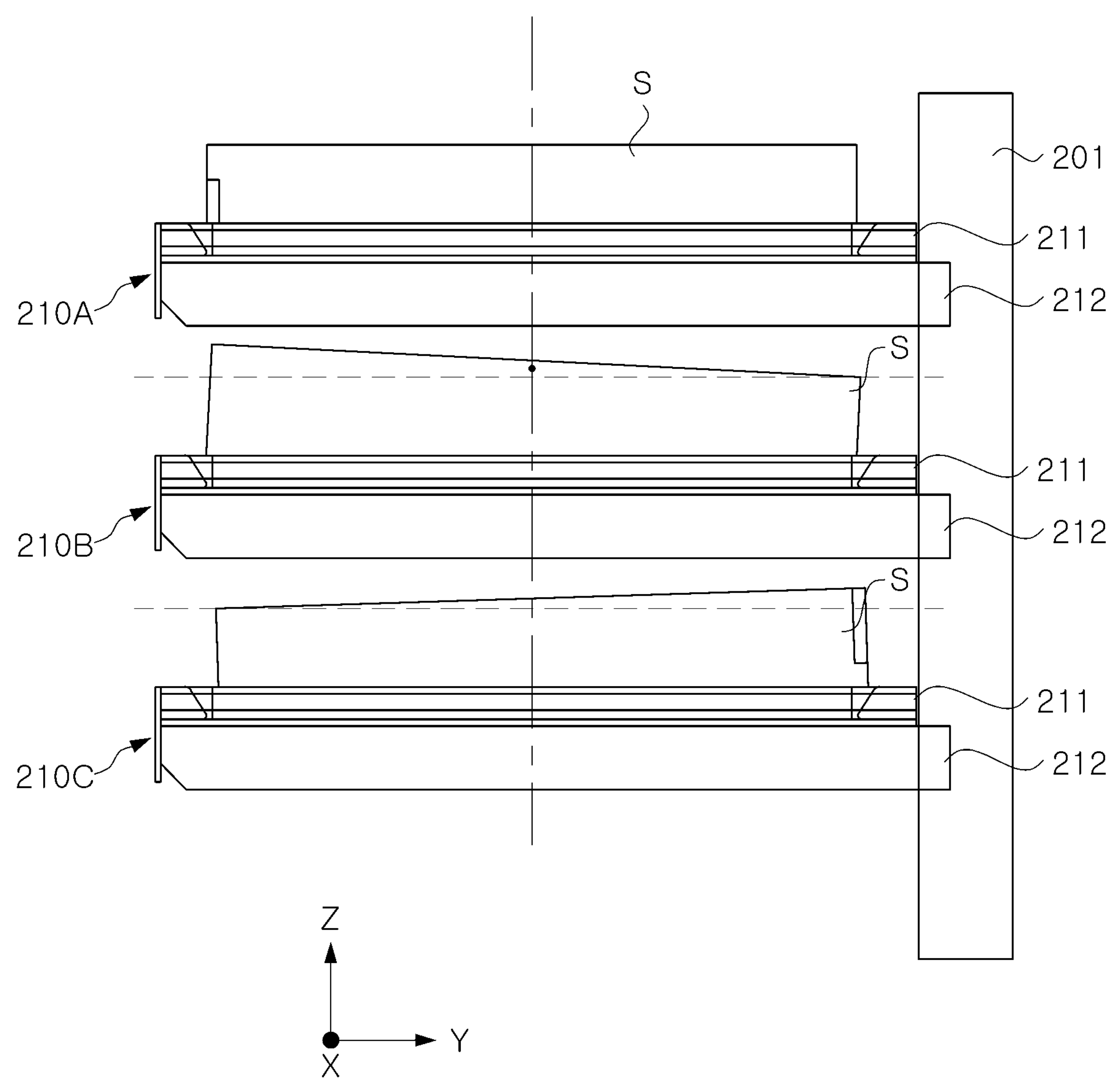
FIG. 10 is a partial plan view of a shelf portion according to an embodiment as seen from a first direction.

FIGS. 6 to 10 illustrate a shelf portion 200 according to an embodiment. In more detail, FIG. 6 is a schematic perspective view of a shelf 210 according to an embodiment, FIG. 7 illustrates an electronic component S seated on the shelf 210 according to an embodiment, FIG. 8 is a plan view of FIG. 7 viewed from a second direction, FIG. 9 is a plan view of the shelf portion 200 according to an embodiment, viewed in a second direction, and FIG. 10 is a plan view of the shelf portion 200 according to an embodiment, viewed in a first direction. Hereinafter, the shelf portion 200 according to an embodiment will be described with reference to FIGS. 6 to 10.

The shelf portion 200 according to an embodiment has a structure in which a shelf frame 201 and a plurality of shelves 210 are arranged in the first direction and a third direction, which is the height direction of the case 100, and the plurality of shelves 210 have both sides open in the second direction such that the electronic component S is transported in the second direction. Therefore, unlike in the stocking system of the related art in which FOUP, FOSB, and the like are moved in or out in the third direction, the stocking device 10 according to an embodiment of the present disclosure allows the electronic component S to enter or exit, or be transported in a direction parallel to the second direction.

As illustrated in FIGS. 6 and 7, the shelf 210 may include a shelf support member 211 and a shelf prop member 212, and the shelf support member 211 may extend in the second direction, and the shelf prop member 212 is provided below the shelf support member 211 and may extend parallel to the shelf support member 211 in the second direction. For example, in the case of the shelf 210, the shelf support member 211 and the shelf prop member 212 are disposed on both sides to be spaced apart from each other in a direction parallel to the first direction, respectively, to support both sides of the electronic component S.

In addition, the shelf support member 211 includes a seating surface 2111 formed to support the electronic component S, and a locking member 2112 provided on the seating surface 2111 and having both ends bent in the first direction to prevent the electronic component S from being separated. In more detail, the locking member 2112 includes a first locking member 2112*a* extending in the second direction and a second locking member 2112*b* bent in the first direction on both ends of the first locking member 2112*a*. At this time, as illustrated in FIG. 8, the first locking member 2112*a* may be formed to be inclined upwardly with respect to the seating surface 2111.

According to the structure of the shelf 210 according to the embodiment described above, the electronic component S may be stored by being seated on the seating surface 2111, and as the first locking member 2112*a* is formed to be inclined upward, the electronic component S may be guided to be easily seated on the seating surface 2111, and if the electronic component S is incorrectly placed on the seating surface 2111, it can be confirmed with the naked eye. In addition, the second locking member 2112*b* may prevent the electronic component S from being separated, and in the future, a module (not illustrated) for SSD gender testing may be installed, and thus, storage and testing may be obtained simultaneously.

In addition, in the shelf 210 according to an embodiment, a pair of shelf support members 211 are disposed spaced apart in a direction parallel to the first direction, and the pair of shelf support members 211 may have different lengths in the second direction. For example, a pair of the shelf support members 211 may be disposed to support both sides of one electronic component S, and since in the case of SSD genders, both side lengths may be different, the shelf 210 may guide the SSD gender to be located in the correct direction, and if it is placed incorrectly, the worker may immediately check the incorrect location with the naked eye.

Furthermore, the arrangement spacing between the plurality of shelves 210 provided in the first storage portion 110 in the first direction or the third direction may be narrower than the arrangement spacing between the plurality of shelves 210 provided in the second storage portion 120 in the first direction or the third direction. In more detail, the arrangement spacing between the plurality of shelves 210 provided in the first port 300 in the first direction or the third direction may be narrower than the arrangement spacing between the plurality of shelves 210 provided in the second port 400 in the first direction or the third direction. For example, in the case of the first port 300, entry and exit may be performed by the mobile robot 11 (see FIG. 1), and the entry and exit operation may be easily performed even if the spacing between the plurality of shelves 210 in the first direction or the third direction is narrower than that of the second port 400 performed manually. As a result, more of the plurality of shelves 210 may be disposed in the first storage portion 110, thereby improving the storage space and efficiency of the electronic component S.

On the other hand, referring to FIGS. 9 and 10, the shelf portion 200 according to an embodiment may further include a protrusion detection sensor 220. The protrusion detection sensor 220 is provided on one end of the shelf portion 200 in the first direction, and may detect that the electronic component S is protruding by irradiating the laser L toward the other end in the first direction. In this case, a plurality of the protrusion detection sensors 220 may be disposed along the shelf frame 201 to be spaced apart in the third direction. Referring to FIG. 10 as an example, among first to third shelves 210A, 210B, and 210C, the electronic component S is properly seated on the first shelf 210A, and no protrusion is detected, while in the case of the second shelf 210B and the third shelf 210C, one side protrudes from a reference line, and the protrusion may be detected by the protrusion detection sensor 220. Therefore, misplacement of the electronic component S stored in the shelf portion 200 may be detected to provide an alarm to the worker.

Figure 11A:
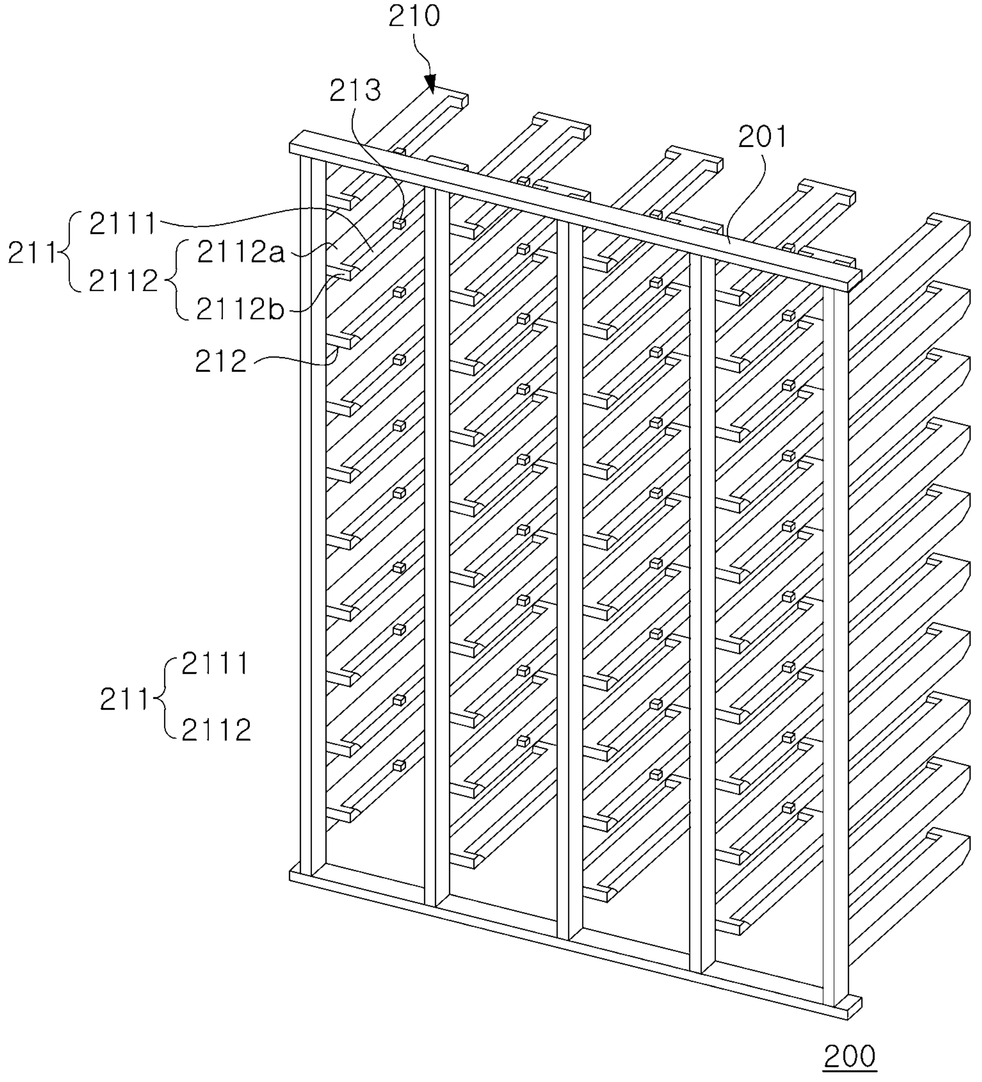
FIG. 11A is a partial perspective view of a shelf portion according to another embodiment.
Figure 11B:
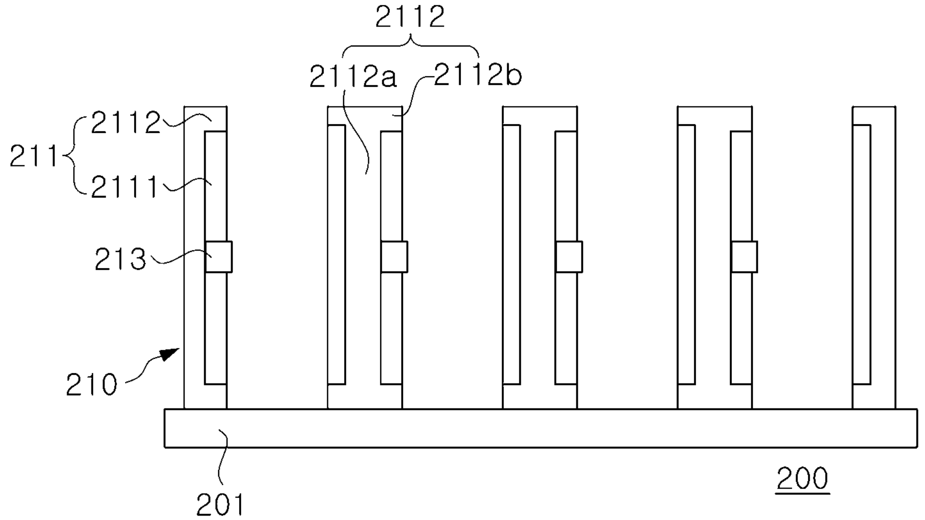
FIG. 11B is a top view of a shelf portion according to another embodiment.

FIGS. 11A and 11B illustrate a schematic perspective view and a top view of a shelf portion 200 according to another embodiment.

As illustrated in FIGS. 11A and 11B, the shelf 210 according to an embodiment may further include a load detection sensor 213 installed on the seating surface 2111. In this case, the load detection sensor 213 may be installed only on one shelf support member 211 of the pair of shelf support members 211, and accordingly, the stocking device 10 according to an embodiment may individually detect whether the electronic component S is loaded on the plurality of shelves 210, and may show the presence or absence of the electronic component S to the worker through a display (not illustrated) by coordinating respective positions of the plurality of shelves 210.

Figure 12:
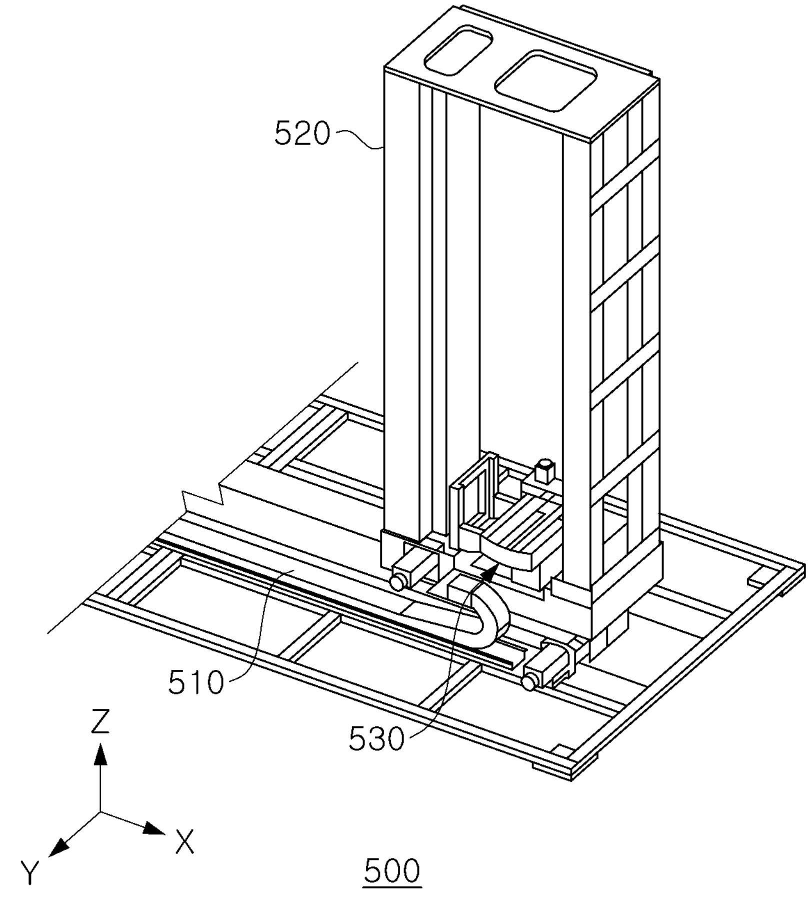
FIG. 12 is a partial perspective view of a crane according to an embodiment.
Figure 13:
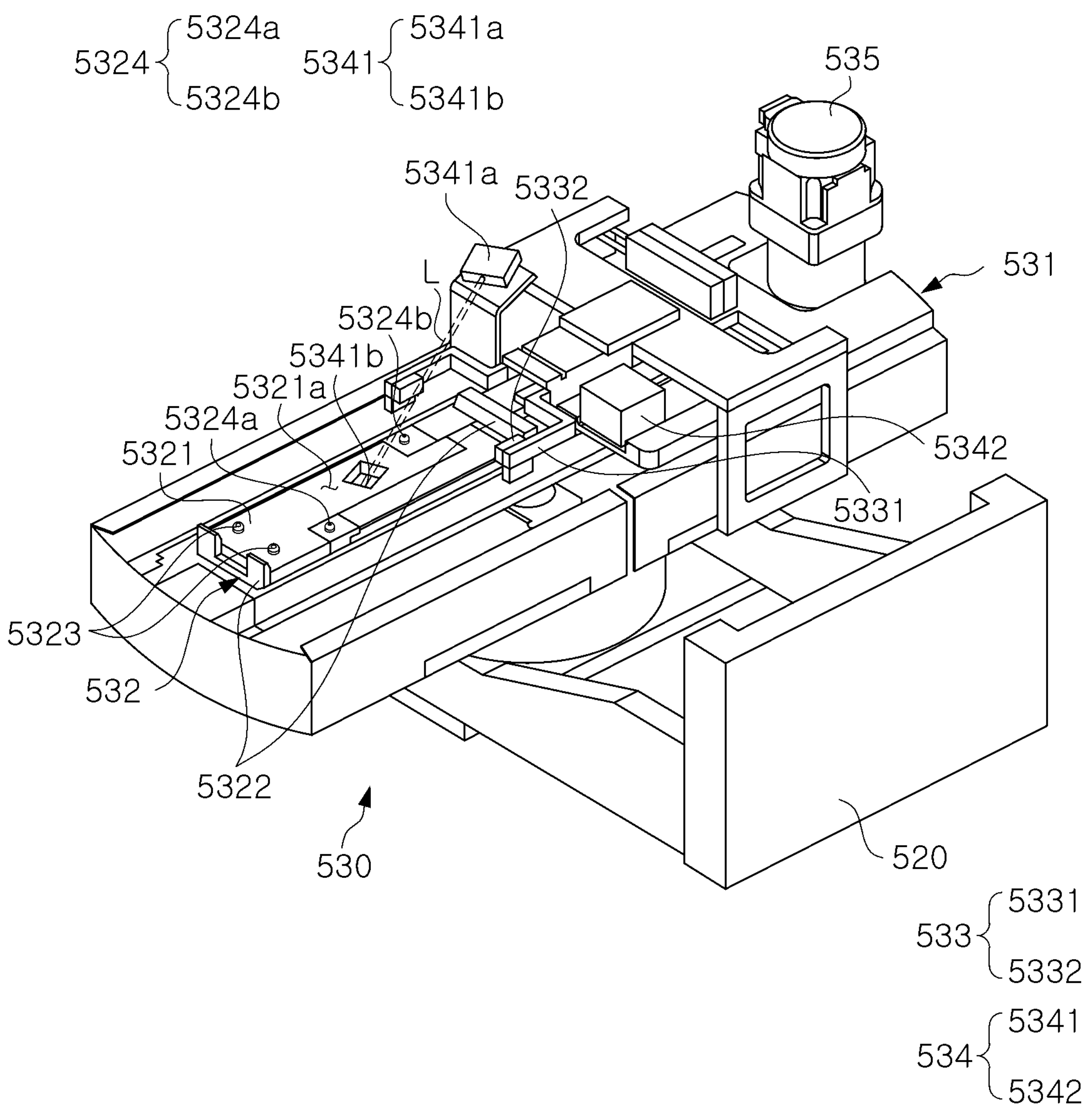
FIG. 13 is a schematic perspective view of a handler device according to an embodiment.

FIGS. 12 to 13 illustrate a crane 500 according to an embodiment. In more detail, FIG. 12 is a partial perspective view of the crane 500 according to an embodiment, and FIG. 13 is a schematic perspective view of a handler device 530 according to an embodiment. Hereinafter, it will be described in detail with reference to FIGS. 12 and 13.

The crane 500 according to an embodiment includes a driving rail 510, a body frame 520, and the handler device 530. The driving rail 510 is disposed in the central portion 130 (see FIG. 2) and may extend in the first direction. The body frame 520 extends in the third direction and is connected to the driving rail 510 and may move in the first direction. The handler device 530 is connected to the body frame 520 inside the body frame 520 and may move in the third direction, and may be rotated clockwise or counterclockwise based on the third direction. As a result, the crane 500 may hold and transport the electronic components S stored in the first storage portion 110 and the second storage portion 120.

In more detail, as illustrated in FIG. 13, the handler device 530 according to an embodiment includes a device body 531, a fork portion 532, and a grip portion 533, and may load and unload electronic components such as SSD gender.

The device body 531 is connected to the body frame 520 and may be transferred to the shelf portion 200 on which the electronic component S is loaded, and may transport the loaded electronic components S from the shelf portion 200. The fork portion 532 is coupled to the device body 531, and the electronic component S may be seated thereon, and the electronic component S may be transported back and forth in the longitudinal direction of the device body 531. In more detail, the fork portion 532 includes a fork member 5321 and a guide wall 5322. The fork member 5321 may extend in the longitudinal direction of the device body 531, and may be provided with a seating surface **5321*a* on the upper surface of which the electronic component S is to be seated. The fork portion 532 enters the shelf portion 200 on which the electronic component S is loaded, such that the seating surface 5321*a* is located at the lower portion of the electronic component S, to load the electronic component S between the guide walls 5322**.

Furthermore, the fork portion 532 according to an embodiment may further include a guide pin 5323. The guide pin 5323 may protrude upward from the seating surface **5321*a*, and may guide the seating position of the electronic component S. For example, the fork portion 532 may guide the position on which the electronic component S is seated by the guide wall 5322, and simultaneously therewith, the guide pin 5323** may additionally compensate for the correct position of the electronic component S.

In addition, the fork portion 532 according to an embodiment may further include a load sensor 5324. The load sensor 5324 is provided on the seating surface **5321*a* and may detect the load of the electronic component S. The load sensor 5324 may include a first load sensor 5324*a* and a second load sensor 5324*b*, and the first load sensor 5324*a* and the second load sensor 5324*b*** may be installed to be spaced apart in the first and second directions, and without being limited thereto, a plurality of load sensors may be installed while being spaced apart from each other.

The grip portion 533 is coupled to the device body 531 and is provided on one end of the fork portion 532 in the longitudinal direction, and may grip both sides of the electronic component S transported to the one end by the fork portion 532. The grip portion 533 includes a grip member 5331 and a grip pad 5332. The grip member 5331 may be provided to move to narrow or widen inwardly or outwardly of the device body 531, and the grip pad 5332 is provided on the inner side surface of the grip member 5331 and may contact and press both sides of the electronic component S. At this time, the grip portion 533 may be positioned to be spaced apart from the upper side of the fork portion 532. Thereby, the grip portion 533 may grip the upper side of the electronic component S seated on the fork portion 532.

Furthermore, the grip pad 5332 may press both sides of the electronic component S side by side, and may have an '¬' shape when viewed in the longitudinal direction of the device body 531. In addition, at least a portion of the grip pad 5332 in contact with the electronic component S may be formed of urethane material to stably grip the electronic component S.

In addition, the handler device 530 according to an embodiment further includes a sensor unit 534, and the sensor unit 534 may include a diagonal sensor 5341. The diagonal sensor 5341 includes a laser light emitting unit 5341*a* provided on one longitudinal end of the fork portion 532 and a laser light receiving unit 5341*b* provided on the seating surface 5321*a*. In this case, the laser light emitting unit 5341*a* and the laser light receiving unit 5341*b* may be positioned to be diagonally spaced apart when viewed in the height direction. At this time, the diagonal sensor 5341 emits laser L from the laser light emitting unit 5341*a* toward the laser light receiving unit 5341*b*, and when the electronic component S is loaded, the light reception of the laser (L) is blocked, and thus, the diagonal sensor 5341 may detect that the electronic component S is loaded on the seating surface 5321*a*.

Furthermore, the sensor unit 534 may further include a barcode reader 5342. The barcode reader 5342 may determine product information by detecting a barcode attached to one side of the electronic component S. The barcode reader 5342 may be provided on one end of the fork portion 532, and may be provided on the opposite side of the diagonal sensor 5341 based on the grip portion 533. When the grip portion 533 grips the upper side of the electronic component S, the barcode reader 5342 may determine product information by reading the barcode attached to the lower portion of the gripped portion.

The handler device 530 according to an embodiment further includes a driving unit 535 and a control unit (not illustrated) connected to the driving unit 535. The driving unit 535 separately drives the fork portion 532 and the grip portion 533, and the control unit (not illustrated) may receive a signal from at least one of the sensor unit 534 or the load sensor 5324 and drive the fork portion 532 and the grip portion 533, respectively. In more detail, the driving unit 535 may move the fork portion 532 forward or backward in the longitudinal direction, and simultaneously or separately, may raise or lower the fork portion 532 in the height direction. Furthermore, the driving unit 535 may narrow or widen the gap between the grip members 5331, and thus the pressing force of the grip portion 533 may be adjusted.

According to the structure of the handler device 530 according to an embodiment described above, the handler device 530 has a configuration in which an electronic component S such as an SSD gender may be lifted by the fork portion 532 and fixed by the grip portion 533. For example, the fork portion 532 is reciprocated in the first direction, and thus approaches the shelf portion 200, advances toward the electronic component S, and moves backward after loading the electronic component S, such that both sides of the electronic component S may be fixed with the grip portion 533. At this time, since the fork portion 532 has a guide wall 5322 and a guide pin 5323, stable loading of the electronic component S is possible and the correct position may be set. In addition, since the upper and lower surfaces of the electronic component S cannot be gripped due to the nature of the product, the grip portion 533 may grip both sides of the electronic component S, and as the grip pad 5332 is formed in an '¬' shaped structure, rotation of the electronic component S may be prevented and the electronic component S may be held stably.

As set forth above, according to an embodiment, a stocking device and a stocking system configured to allow electronic components such as SSD gender to be entered and exited by an Auto Mobile Robot (AMR) and manually may be provided.

While example embodiments have been illustrated and described above, it will be apparent to those skilled in the art that modifications and variations could be made without departing from the scope of the present disclosure as defined by the appended claims.

What is claimed is:

1. A stocking device comprising:

a case including a central portion therein, extending a first direction, a longitudinal direction, and provided with a first storage portion and a second storage portion on both sides of the central portion in a second direction, a width direction;

a shelf portion provided in the first storage portion and the second storage portion and having a plurality of shelves with an electronic component loaded thereon;

a first port located in the first storage portion, and having a first open surface in which at least a portion of a side of the case is open in the second direction to communicate externally, the first port being a port through which the electronic component enters and exits;

a second port located in the second storage portion and having a second open surface in which at least a portion of the side of the case is open in the second direction to communicate externally, the second port being a port through which the electronic component enters and exits; and a crane installed in the central portion and transporting the electronic component, wherein the shelf portion includes shelf support members extending in the second direction, and, in the shelf portion, a pair of the shelf support members are spaced apart in a direction, parallel to the first direction, the pair of shelf support members having different lengths in the second direction.

2. The stocking device of claim 1, further comprising a charging pad installed outside of the case, installed on a first port side, and charging a mobile robot.

3. The stocking device of claim 2, wherein the first port further includes a first auto shutter provided on the first open surface and opening and closing the first open surface, and the second port further includes a second auto shutter provided on a second inner side surface communicating with the central portion and opening and closing the second inner side surface.

4. The stocking device of claim 3, wherein in the shelf portion, a shelf frame and a plurality of shelves are arranged in the first direction and a third direction, a height direction of the case, wherein the plurality of shelves have a structure in which both sides in the second direction are open such that the electronic component is transferred in the second direction.

5. The stocking device of claim 4, wherein the shelf portion includes:

a shelf prop member provided below the shelf support member, wherein the shelf support member includes, a seating surface provided to support the electronic component; and a locking member provided on an upper portion of the seating surface and having both ends bent in the first direction to prevent the electronic component from being separated.

6. The stocking device of claim 5, wherein the locking member includes:

a first locking member extending in the second direction; and a second locking member bent from both ends of the first locking member in the first direction, wherein the first locking member is inclined upwardly based on the seating surface.

7. The stocking device of claim 5, wherein an arrangement spacing of a plurality of shelves provided in the first storage portion in the first direction or the third direction is narrower than an arrangement spacing of a plurality of shelves provided in the second storage portion in the first direction or the third direction.

8. The stocking device of claim 5, wherein the shelf further includes a load detection sensor installed on the seating surface.

9. The stocking device of claim 5, wherein the shelf portion further includes a protrusion detection sensor provided on one end in the first direction and detecting that the electronic component protrudes by irradiating a laser toward the other end in the first direction.

10. The stocking device of claim 4, wherein the crane further includes, a driving rail disposed in the central portion and extending in the first direction;

a body frame extending in the third direction, connected to the driving rail and moving in the first direction; and a handler device moving in the third direction inside the body frame and gripping and transferring the electronic component.

11. The stocking device of claim 10, wherein the handler device includes, a device body;

a fork portion coupled to the device body and transferring the electronic component in the second direction; and a grip portion coupled to the device body, provided on one end of the fork portion, and gripping both sides of the electronic component transferred to the one end.

12. A stocking system comprising:

a case including a central portion therein, extending in a first direction, a longitudinal direction, and provided with a first storage portion and a second storage portion on both sides of the central portion in a second direction, a width direction;

a shelf portion provided in the first storage portion and the second storage portion and having a plurality of shelves with an electronic component loaded thereon;

a first port located in the first storage portion, and having a first open surface in which at least a portion of a side of the case is open in the second direction to communicate externally, the first port being a port through which the electronic component enters and exits;

a second port located in the second storage portion, and having a second open surface in which at least a portion of the side of the case is open in the second direction to communicate externally, the second port being a port through which the electronic component enters and exits;

a crane installed in the central portion and transferring the electronic component; and a mobile robot disposed on a first open surface side and transferring the electronic component into the first port, wherein the shelf portion includes shelf support members extending in the second direction, and, in the shelf portion, a pair of the shelf support members are spaced apart in a direction, parallel to the first direction, the pair of shelf support members having different lengths in the second direction.

13. The stocking system of claim 12, further comprising:

a first detection sensor installed on the first open surface side and detecting an approach of the mobile robot;

a second detection sensor installed on a second open surface side and detecting an approach of a worker.

14. The stocking system of claim 13, wherein the first port includes a first auto shutter opening and closing the first open surface communicating externally, the second port includes a second auto shutter provided on one side communicating with the central portion and opening and closing the one side.

15. The stocking system of claim 13, wherein the crane includes, a driving rail installed to extend in the first direction;

a body frame installed to extend in a third direction, a height direction of the case, and moving in the first direction along the driving rail; and a handler device installed inside the body frame and moving in the third direction.

16. The stocking system of claim 15, wherein the handler device includes, a device body;

a fork portion coupled to the device body and transferring the electronic component in the second direction;

a grip portion coupled to the device body, provided on one end of the fork portion, and gripping both sides of the electronic component transferred to the one end; and a correct position sensor attached to the handler device and detecting presence or absence of the electronic component mounted on the shelves.

17. The stocking system of claim 12, further comprising:

a charging pad installed outside of the case, installed on a side of the first port, and charging the mobile robot; and a third detection sensor detecting alignment of the charging pad and the mobile robot, wherein the mobile robot receives a signal from the third detection sensor and is aligned with the charging pad in a direction, parallel to the second direction.

18. The stocking system of claim 17, further comprising:

a fourth detection sensor installed on the first open surface side and detecting alignment between a hand of the mobile robot and the shelves, wherein the mobile robot receives a signal from the fourth detection sensor, and controls the hand and the shelves to be aligned in a direction, parallel to the second direction.

19. A stocking device comprising:

a case including a central portion therein, extending in a first direction, a longitudinal direction, and having a first storage portion and a second storage portion on both sides of the central portion in a second direction, a width direction;

a shelf portion provided in the first storage portion and the second storage portion and having a plurality of shelves with electronic components loaded thereon;

a first port located in the first storage portion, and having a first open surface in which at least a portion of a side of the case is open in the second direction to communicate externally, the first port being a port through which the electronic components enter and exit;

a second port located in the second storage portion, and having a second open surface in which at least a portion of the side of the case is open in the second direction to communicate externally, the second port being a port through which the electronic components enter and exit;

a crane installed in the central portion and transferring the electronic components; and a charging pad installed outside of the case, installed on a side of the first port, and charging a mobile robot, wherein in the shelf portion, a shelf frame and a plurality of shelves are arranged in the first direction and a third direction, a height direction of the case, and the plurality of shelves have a structure in which both sides in the second direction are open such that the electronic components are transferred in the second direction, the shelf portion includes shelf support members extending in the second direction, and, in the shelf portion, a pair of the shelf support members are spaced apart in a direction, parallel to the first direction, the pair of shelf support members having different lengths in the second direction.

* * * * *